(12) United States Patent
Tung et al.

(10) Patent No.: US 8,148,891 B2
(45) Date of Patent: Apr. 3, 2012

(54) ELECTRON IMPEDING LAYER FOR HIGH EFFICIENCY PHOSPHORESCENT OLEDS

(75) Inventors: Yeh Tung, Princeton, NJ (US); Brian W. D'Andrade, Westampton, NJ (US); Michael S. Weaver, Princeton, NJ (US); James Esler, Levittown, PA (US)

(73) Assignee: Universal Display Corporation, Ewing, NJ (US)

( * ) Notice: Subject to any disclaimer, the term of this patent is extended or adjusted under 35 U.S.C. 154(b) by 761 days.

(21) Appl. No.: 11/242,025

(22) Filed: Oct. 4, 2005

(65) Prior Publication Data

US 2007/0075631 A1 Apr. 5, 2007

(51) Int. Cl.
*H05B 33/14* (2006.01)
*B32B 9/00* (2006.01)
*B32B 19/00* (2006.01)

(52) U.S. Cl. ......... 313/504; 428/690; 428/917; 313/506

(58) Field of Classification Search .................. 428/690, 428/917; 313/504, 506
See application file for complete search history.

(56) References Cited

U.S. PATENT DOCUMENTS

| | | | |
|---|---|---|---|
| 4,720,432 A * | 1/1988 | VanSlyke et al. | .............. 428/457 |
| 4,769,292 A | 9/1988 | Tang et al. | |
| 5,247,190 A | 9/1993 | Friend et al. | |
| 5,703,436 A | 12/1997 | Forrest et al. | |
| 5,707,745 A | 1/1998 | Forrest et al. | |
| 5,834,893 A | 11/1998 | Bulovic et al. | |
| 5,844,363 A | 12/1998 | Gu et al. | |
| 6,013,982 A | 1/2000 | Thompson et al. | |
| 6,087,196 A | 7/2000 | Sturm et al. | |
| 6,091,195 A | 7/2000 | Forrest et al. | |
| 6,294,398 B1 | 9/2001 | Kim et al. | |
| 6,303,238 B1 | 10/2001 | Thompson et al. | |
| 6,310,360 B1 | 10/2001 | Forrest | |
| 6,337,102 B1 | 1/2002 | Forrest et al. | |
| 6,468,819 B1 | 10/2002 | Kim et al. | |
| 6,548,956 B2 | 4/2003 | Forrest et al. | |
| 6,576,134 B1 | 6/2003 | Agner | |
| 6,602,540 B2 | 8/2003 | Gu et al. | |
| 7,071,615 B2 | 7/2006 | Lu et al. | |
| 7,312,510 B2 * | 12/2007 | Shin et al. | ....................... 257/473 |
| 2002/0034656 A1 * | 3/2002 | Thompson et al. | ............ 428/690 |
| 2002/0122900 A1 * | 9/2002 | Ueda et al. | ...................... 428/1.1 |
| 2002/0175619 A1 * | 11/2002 | Kita et al. | ...................... 313/504 |
| 2002/0182441 A1 | 12/2002 | Lamansky et al. | |

(Continued)

FOREIGN PATENT DOCUMENTS

JP 2004 522276 7/2004

(Continued)

OTHER PUBLICATIONS

JP 2004-362914 to Fukuoka et al. Published Dec. 24, 2004. Machine translation included.*

(Continued)

*Primary Examiner* — Toan Ton
*Assistant Examiner* — Zachary Snyder
(74) *Attorney, Agent, or Firm* — Kenyon & Kenyon LLP

(57) ABSTRACT

The present invention relates to OLEDs comprising an electron impeding layer between the cathode and the emissive layer. An organic light emitting device, comprising: an anode; a hole transport layer; an organic emissive layer comprising an emissive layer host and an emissive dopant; an electron impeding layer; an electron transport layer; and a cathode disposed, in that order, over a substrate.

25 Claims, 15 Drawing Sheets

U.S. PATENT DOCUMENTS

| | | | |
|---|---|---|---|
| 2002/0197511 A1* | 12/2002 | D'Andrade et al. | 428/690 |
| 2003/0072964 A1 | 4/2003 | Kwong et al. | |
| 2003/0230980 A1* | 12/2003 | Forrest et al. | 313/600 |
| 2005/0019604 A1* | 1/2005 | Thompson et al. | 428/690 |
| 2005/0064235 A1 | 3/2005 | Liao | |
| 2005/0074630 A1* | 4/2005 | Kanno et al. | 428/690 |
| 2005/0168137 A1 | 8/2005 | Adamovich et al. | |
| 2005/0276994 A1* | 12/2005 | Iwawaki et al. | 428/690 |
| 2006/0006792 A1 | 1/2006 | Strip | |
| 2006/0008670 A1* | 1/2006 | Lin et al. | 428/690 |
| 2006/0008673 A1* | 1/2006 | Kwong et al. | 428/690 |
| 2006/0082285 A1 | 4/2006 | Wu et al. | |
| 2006/0240279 A1* | 10/2006 | Adamovich et al. | 428/690 |
| 2006/0279204 A1* | 12/2006 | Forrest et al. | 313/506 |

FOREIGN PATENT DOCUMENTS

| | | |
|---|---|---|
| JP | 2005 502165 | 1/2005 |
| JP | 2007 507107 | 3/2007 |
| TW | 240 593 B | 9/2005 |
| WO | 02/074015 | 9/2002 |
| WO | 02/091814 A2 | 11/2002 |
| WO | 03/022007 A2 | 3/2003 |
| WO | 2005/038941 A2 | 4/2005 |

OTHER PUBLICATIONS

Johnson et al., "Electrical Properties of Staggered Electrode, Solution-Processed, Polycrystalline Tetrabenzoporphyrin Field Effect Transistors", IEEE Transactions on Electron Devices, IEEE Service Center, Piscataway, NJ, USA, vol. 52, No. 7, Jul. 2005, pp. 1497-1503.

PCT International Search Report from PCT/US2006/037788, mailed on Oct. 26, 2007.

U.S. Appl. No. 10/233,470, filed Sep. 4, 2002, Forrest et al.

U.S. Appl. No. 60/678,170, filed May 6, 2005, Tsai et al.

U.S. Appl. No. 60/701,929, filed Jul. 25, 2005, Lin et al.

U.S. Appl. No. 60/718,336, filed Sep. 20, 2005, Lin et al.

U.S. Appl. No. 11/241,981, filed Oct. 4, 2005, Tsai et al.

Adachi et al., "Nearly 100% internal phosphorescence efficiency in an organic light emitting device", J. App. Phys. vol. 90 No. 10, 5048-51, Nov. 15, 2001.

Baldo et al., "Highly Efficient Phosphorescent Emission from Organic Electroluminescent Devices", Nature 395:151-154, 1998.

Baldo et al., "Very high efficiency green organic light-emitting devices based on electrophosphorescence," Appl. Phys.Lett. 75(3):4-6, 1999.

* cited by examiner

Compound 2 devices (EQE)

Compound 2

Compound 3 devices (EQE)

Compound 4 devices (EQE)

Compound 4

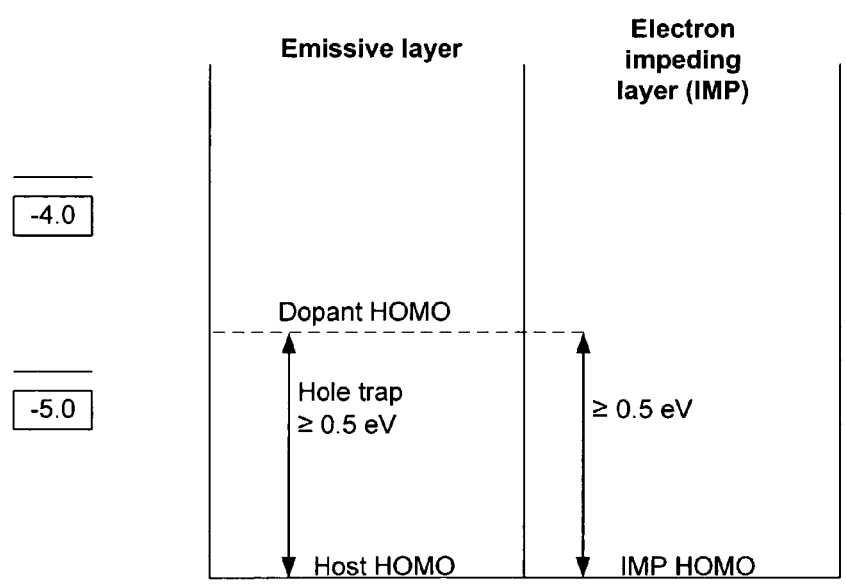
Figure 14: Exemplary HOMO Energy Levels for a Device Having an Electron Impeding Layer Figure 15a: Device Having an Electron Impeding Layer
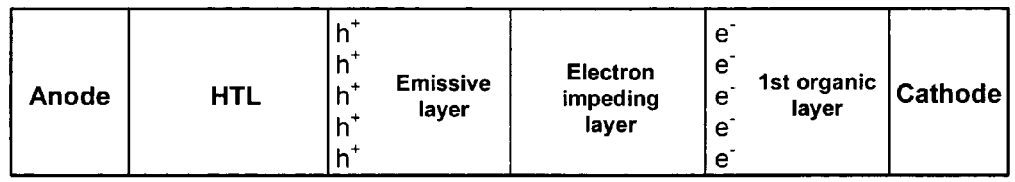
Figure 15b: Energy Level Diagram for a Device Having an Electron Impeding Layer
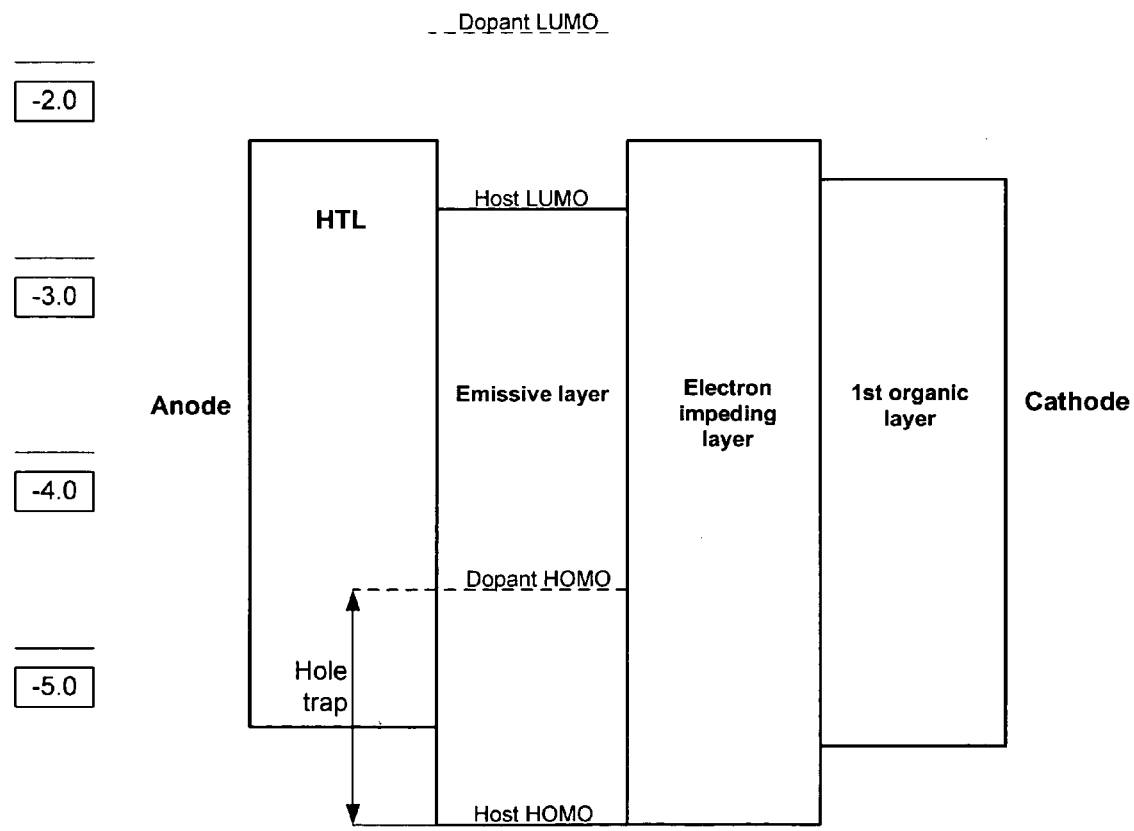

ELECTRON IMPEDING LAYER FOR HIGH EFFICIENCY PHOSPHORESCENT OLEDS

The claimed invention was made by, on behalf of, and/or in connection with one or more of the following parties to a joint university corporation research agreement: Princeton University, The University of Southern California, and the Universal Display Corporation. The agreement was in effect on and before the date the claimed invention was made, and the claimed invention was made as a result of activities undertaken within the scope of the agreement.

FIELD OF THE INVENTION

The present invention relates to organic light emitting devices (OLEDs), and more specifically to phosphorescent OLEDs having an electron impeding layer.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules. In general, a small molecule has a well-defined chemical formula with a single molecular weight, whereas a polymer has a chemical formula and a molecular weight that may vary from molecule to molecule. As used herein, "organic" includes metal complexes of hydrocarbyl and heteroatom-substituted hydrocarbyl ligands.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

OLED devices are generally (but not always) intended to emit light through at least one of the electrodes, and one or more transparent electrodes may be useful in an organic opto-electronic devices. For example, a transparent electrode material, such as indium tin oxide (ITO), may be used as the bottom electrode. A transparent top electrode, such as disclosed in U.S. Pat. Nos. 5,703,436 and 5,707,745, which are incorporated by reference in their entireties, may also be used. For a device intended to emit light only through the bottom electrode, the top electrode does not need to be transparent, and may be comprised of a thick and reflective metal layer having a high electrical conductivity. Similarly, for a device intended to emit light only through the top electrode, the bottom electrode may be opaque and/or reflective. Where an electrode does not need to be transparent, using a thicker layer may provide better conductivity, and using a reflective electrode may increase the amount of light emitted through the other electrode, by reflecting light back towards the transparent electrode. Fully transparent devices may also be fabricated, where both electrodes are transparent. Side emitting OLEDs may also be fabricated, and one or both electrodes may be opaque or reflective in such devices.

As used herein, "top" means furthest away from the substrate, while "bottom" means closest to the substrate. For example, for a device having two electrodes, the bottom electrode is the electrode closest to the substrate, and is generally the first electrode fabricated. The bottom electrode has two surfaces, a bottom surface closest to the substrate, and a top surface further away from the substrate. Where a first layer is described as "disposed over" a second layer, the first layer is disposed further away from substrate. There may be other layers between the first and second layer, unless it is specified that the first layer is "in physical contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

SUMMARY OF THE INVENTION

In one embodiment, the present invention provides an organic light emitting device, comprising: an anode; a hole transport layer; an organic emissive layer comprising an emissive layer host and an emissive dopant; an electron impeding layer; an electron transport layer; and a cathode disposed, in that order, over a substrate.

Preferably, the HOMO of the emissive layer host is at least about 0.5 eV lower, more preferably about 0.5 eV to about 0.8 eV lower, than the HOMO of the emissive dopant. Preferably, the electron impeding layer consists essentially of a hole transporting material or an ambipolar material such as mCBP.

Preferably, the device emits blue light. In a specific preferred embodiment, the emissive dopant is compound 1.

In another embodiment, the present invention provides an OLED comprising an anode; a cathode; an organic emissive layer disposed between the anode and the cathode, the organic emissive layer comprising an emissive layer host and an emissive dopant, wherein the HOMO of the emissive layer host is at least about 0.5 eV lower, preferably about 0.5 eV to about 0.8 eV lower, than the HOMO of the emissive dopant; a first organic layer disposed between the organic emissive layer and the cathode; a second organic layer disposed between, and in direct contact with, the organic emissive layer and the first organic layer; wherein the second organic layer consists essentially of a hole transporting material or an ambipolar material.

In another embodiment, the present invention provides an OLED comprising an anode; a cathode; an organic emissive layer disposed between the anode and the cathode, the organic emissive layer comprising an emissive layer host and an emissive dopant, wherein the HOMO of the emissive layer host is at least about 0.5 eV lower, preferably about 0.5 eV to about 0.8 eV lower, than the HOMO of the emissive dopant; a first organic layer disposed between the organic emissive layer and the cathode; a second organic layer disposed between, and in direct contact with, the organic emissive layer and the first organic layer; wherein the second organic layer has a relative electron mobility not more than 0.001 of the electron mobility of Bphen. Preferably, the second organic layer consists essentially of a material, such that when said material is used in a similar device wherein the first organic layer is $Alq_3$, increasing the thickness of the second organic layer will cause emission from the first organic layer.

In another embodiment, the present invention provides an OLED comprising an anode; a cathode; an organic emissive layer disposed between the anode and the cathode, the organic emissive layer comprising an emissive layer host and an emissive dopant, wherein the HOMO of the emissive layer host is at least about 0.5 eV lower, preferably about 0.5 eV to about 0.8 eV lower, than the HOMO of the emissive dopant; and a means for accumulating electrons between the cathode and the emissive layer.

BRIEF DESCRIPTION OF THE DRAWINGS

FIG. 14 shows exemplary HOMO energy levels for a device having an electron impeding layer.

FIG. 15a and FIG. 15b show a device having an electron impeding layer and an energy level diagram for the device.

DETAILED DESCRIPTION

Figure 1:
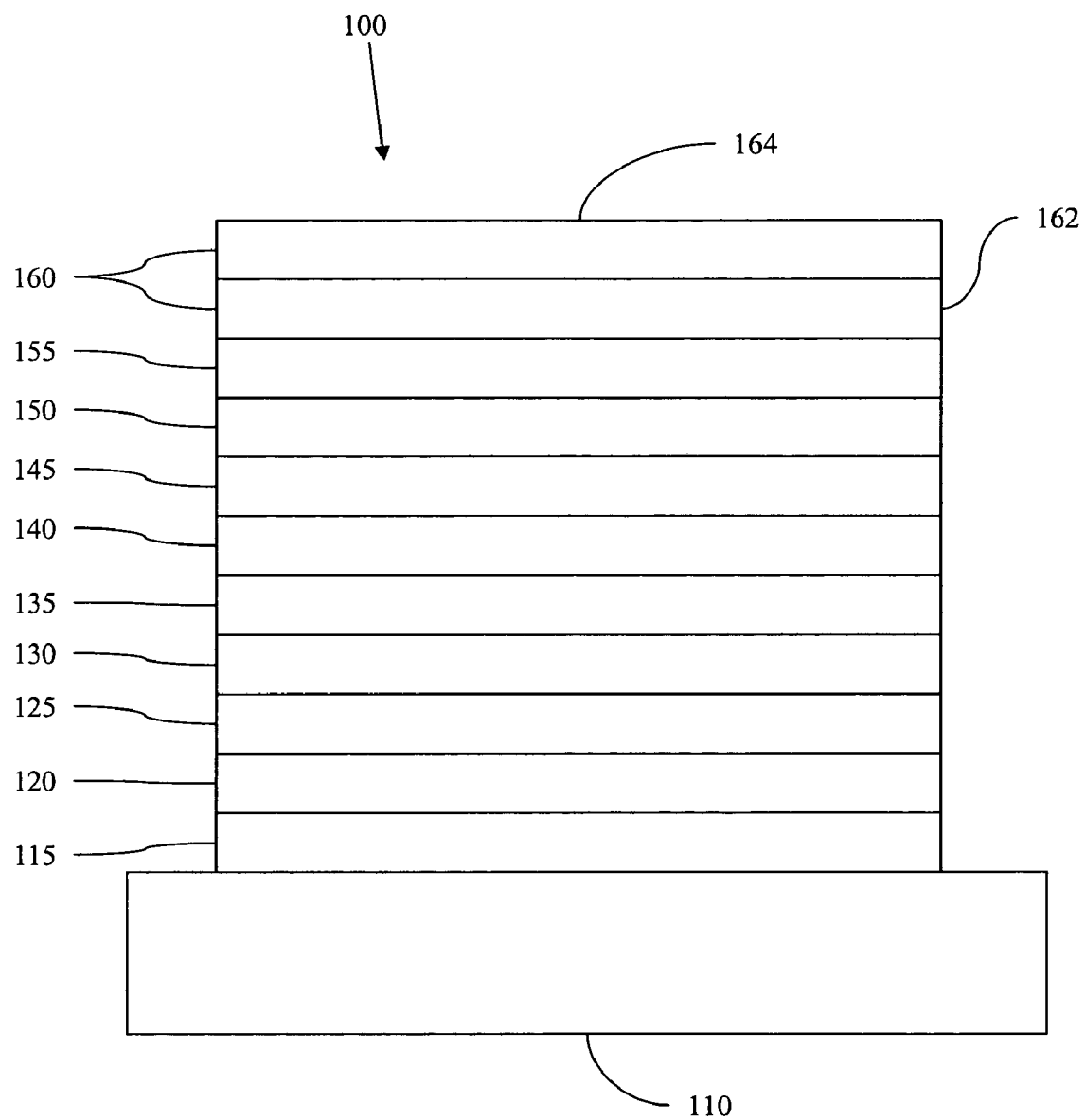
FIG. 1 shows an organic light emitting device having separate electron transport, hole transport, and emissive layers, as well as other layers.

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 1, 4-6 (1999) ("Baldo-II"), which are incorporated by reference in their entireties. Phosphorescence may be referred to as a "forbidden" transition because the transition requires a change in spin states, and quantum mechanics indicates that such a transition is not favored. As a result, phosphorescence generally occurs in a time frame exceeding at least 10 nanoseconds, and typically greater than 100 nanoseconds. If the natural radiative lifetime of phosphorescence is too long, triplets may decay by a non-radiative mechanism, such that no light is emitted. Organic phosphorescence is also often observed in molecules containing heteroatoms with unshared pairs of electrons at very low temperatures. 2,2'-bipyridine is such a molecule. Non-radiative decay mechanisms are typically temperature dependent, such that an organic material that exhibits phosphorescence at liquid nitrogen temperatures typically does not exhibit phosphorescence at room temperature. But, as demonstrated by Baldo, this problem may be addressed by selecting phosphorescent compounds that do phosphoresce at room temperature. Representative emissive layers include doped or undoped phosphorescent organometallic materials such as disclosed in U.S. Pat. Nos. 6,303,238 and 6,310,360; U.S. Patent Application Publication Nos. 2002-0034656; 2002-0182441; 2003-0072964; and WO-02/074015.

Generally, the excitons in an OLED are believed to be created in a ratio of about 3:1, i.e., approximately 75% triplets and 25% singlets. See, Adachi et al., "Nearly 100% Internal Phosphorescent Efficiency In An Organic Light Emitting Device," J. Appl. Phys., 90, 5048 (2001), which is incorporated by reference in its entirety. In many cases, singlet excitons may readily transfer their energy to triplet excited states via "intersystem crossing," whereas triplet excitons may not readily transfer their energy to singlet excited states. As a result, 100% internal quantum efficiency is theoretically possible with phosphorescent OLEDs. In a fluorescent device, the energy of triplet excitons is generally lost to radiationless decay processes that heat-up the device, resulting in much lower internal quantum efficiencies. OLEDs utilizing phosphorescent materials that emit from triplet excited states are disclosed, for example, in U.S. Pat. No. 6,303,238, which is incorporated by reference in its entirety.

Phosphorescence may be preceded by a transition from a triplet excited state to an intermediate non-triplet state from which the emissive decay occurs. For example, organic molecules coordinated to lanthanide elements often phosphoresce from excited states localized on the lanthanide metal. However, such materials do not phosphoresce directly from a triplet excited state but instead emit from an atomic excited state centered on the lanthanide metal ion. The europium diketonate complexes illustrate one group of these types of species.

Phosphorescence from triplets can be enhanced over fluorescence by confining, preferably through bonding, the organic molecule in close proximity to an atom of high atomic number. This phenomenon, called the heavy atom effect, is created by a mechanism known as spin-orbit coupling. Such a phosphorescent transition may be observed from an excited metal-to-ligand charge transfer (MLCT) state of an organometallic molecule such as tris(2-phenylpyridine)iridium(III).

As used herein, the term "triplet energy" refers to an energy corresponding to the highest energy feature discernable in the phosphorescence spectrum of a given material. The highest energy feature is not necessarily the peak having the greatest intensity in the phosphorescence spectrum, and could, for example, be a local maximum of a clear shoulder on the high energy side of such a peak.

The term "organometallic" as used herein is as generally understood by one of ordinary skill in the art and as given, for example, in "Inorganic Chemistry" (2nd Edition) by Gary L. Miessler and Donald A. Tarr, Prentice Hall (1998). Thus, the term organometallic refers to compounds which have an organic group bonded to a metal through a carbon-metal bond. This class does not include per se coordination compounds, which are substances having only donor bonds from heteroatoms, such as metal complexes of amines, halides, pseudohalides (CN, etc.), and the like. In practice organometallic compounds generally comprise, in addition to one or more carbon-metal bonds to an organic species, one or more donor bonds from a heteroatom. The carbon-metal bond to an organic species refers to a direct bond between a metal and a carbon atom of an organic group, such as phenyl, alkyl, alkenyl, etc., but does not refer to a metal bond to an "inorganic carbon," such as the carbon of CN or CO.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, and a cathode 160. Cathode 160 is a compound cathode having a first conductive layer 162 and a second conductive layer 164. Device 100 may be fabricated by depositing the layers described, in order.

Substrate 110 may be any suitable substrate that provides desired structural properties. Substrate 110 may be flexible or rigid. Substrate 110 may be transparent, translucent or opaque. Plastic and glass are examples of preferred rigid substrate materials. Plastic and metal foils are examples of preferred flexible substrate materials. Substrate 110 may be a semiconductor material in order to facilitate the fabrication of circuitry. For example, substrate 110 may be a silicon wafer upon which circuits are fabricated, capable of controlling OLEDs subsequently deposited on the substrate. Other substrates may be used. The material and thickness of substrate 110 may be chosen to obtain desired structural and optical properties.

Anode 115 may be any suitable anode that is sufficiently conductive to transport holes to the organic layers. The material of anode 115 preferably has a work function higher than about 4 eV (a "high work function material"). Preferred anode materials include conductive metal oxides, such as indium tin oxide (ITO) and indium zinc oxide (IZO), aluminum zinc oxide (AlZnO), and metals. Anode 115 (and substrate 110) may be sufficiently transparent to create a bottom-emitting device. A preferred transparent substrate and anode combination is commercially available ITO (anode) deposited on glass or plastic (substrate). A flexible and transparent substrate-anode combination is disclosed in U.S. Pat. Nos. 5,844,363 and 6,602,540 B2, which are incorporated by reference in their entireties. Anode 115 may be opaque and/or reflective. A reflective anode 115 may be preferred for some top-emitting devices, to increase the amount of light emitted from the top of the device. The material and thickness of anode 115 may be chosen to obtain desired conductive and optical properties. Where anode 115 is transparent, there may be a range of thickness for a particular material that is thick enough to provide the desired conductivity, yet thin enough to provide the desired degree of transparency. Other anode materials and structures may be used.

Hole transport layer 125 may include a material capable of transporting holes. Hole transport layer 130 may be intrinsic (undoped), or doped. Doping may be used to enhance conductivity. α-NPD and TPD are examples of intrinsic hole transport layers. An example of a p-doped hole transport layer is m-MTDATA doped with $F_4$-TCNQ at a molar ratio of 50:1, as disclosed in United States Patent Application Publication No. 2003-02309890 to Forrest et al., which is incorporated by reference in its entirety. Other hole transport layers may be used.

Emissive layer 135 may include an organic material capable of emitting light when a current is passed between anode 115 and cathode 160. Preferably, emissive layer 135 contains a phosphorescent emissive material, although fluorescent emissive materials may also be used. Phosphorescent materials are preferred because of the higher luminescent efficiencies associated with such materials. Emissive layer 135 may also comprise a host material capable of transporting electrons and/or holes, doped with an emissive material that may trap electrons, holes, and/or excitons, such that excitons relax from the emissive material via a photoemissive mechanism. Emissive layer 135 may comprise a single material that combines transport and emissive properties. Whether the emissive material is a dopant or a major constituent, emissive layer 135 may comprise other materials, such as dopants that tune the emission of the emissive material. Emissive layer 135 may include a plurality of emissive materials capable of, in combination, emitting a desired spectrum of light. Examples of phosphorescent emissive materials include Ir(ppy)$_3$. Examples of fluorescent emissive materials include DCM and DMQA. Examples of host materials include Alq$_3$, CBP and mCP. Examples of emissive and host materials are disclosed in U.S. Pat. No. 6,303,238 to Thompson et al., which is incorporated by reference in its entirety. Emissive material may be included in emissive layer 135 in a number of ways. For example, an emissive small molecule may be incorporated into a polymer. This may be accomplished by several ways: by doping the small molecule into the polymer either as a separate and distinct molecular species; or by incorporating the small molecule into the backbone of the polymer, so as to form a co-polymer; or by bonding the small molecule as a pendant group on the polymer. Other emissive layer materials and structures may be used. For example, a small molecule emissive material may be present as the core of a dendrimer.

Many useful emissive materials include one or more ligands bound to a metal center. A ligand may be referred to as "photoactive" if it contributes directly to the photoactive properties of an organometallic emissive material. A "photoactive" ligand may provide, in conjunction with a metal, the energy levels from which and to which an electron moves when a photon is emitted. Other ligands may be referred to as "ancillary." Ancillary ligands may modify the photoactive properties of the molecule, for example by shifting the energy levels of a photoactive ligand, but ancillary ligands do not directly provide the energy levels involved in light emission. A ligand that is photoactive in one molecule may be ancillary in another. These definitions of photoactive and ancillary are intended as non-limiting theories.

Electron transport layer 145 may include a material capable of transporting electrons. Electron transport layer 145 may be intrinsic (undoped), or doped. Doping may be used to enhance conductivity. $Alq_3$ is an example of an intrinsic electron transport layer. An example of an n-doped electron transport layer is BPhen doped with Li at a molar ratio of 1:1, as disclosed in United States Patent Application Publication No. 2003-02309890 to Forrest et al., which is incorporated by reference in its entirety. Other electron transport layers may be used.

The charge carrying component of the electron transport layer may be selected such that electrons can be efficiently injected from the cathode into the LUMO (Lowest Unoccupied Molecular Orbital) energy level of the electron transport layer. The "charge carrying component" is the material responsible for the LUMO energy level that actually transports electrons. This component may be the base material, or it may be a dopant. The LUMO energy level of an organic material may be generally characterized by the electron affinity of that material and the relative electron injection efficiency of a cathode may be generally characterized in terms of the work function of the cathode material. This means that the preferred properties of an electron transport layer and the adjacent cathode may be specified in terms of the electron affinity of the charge carrying component of the ETL and the work function of the cathode material. In particular, when high electron injection efficiency is desired, the work function of the cathode material is preferably not greater than the electron affinity of the charge carrying component of the electron transport layer by more than about 0.75 eV, more preferably, by not more than about 0.5 eV. Similar considerations apply to any layer into which electrons are being injected.

Cathode 160 may be any suitable material or combination of materials known to the art, such that cathode 160 is capable of conducting electrons and injecting them into the organic layers of device 100. Cathode 160 may be transparent or opaque, and may be reflective. Metals and metal oxides are examples of suitable cathode materials. Cathode 160 may be a single layer, or may have a compound structure. FIG. 1 shows a compound cathode 160 having a thin metal layer 162 and a thicker conductive metal oxide layer 164. In a compound cathode, preferred materials for the thicker layer 164 include ITO, IZO, and other materials known to the art. U.S. Pat. Nos. 5,703,436, 5,707,745, 6,548,956 B2 and 6,576,134 B2, which are incorporated by reference in their entireties, disclose examples of cathodes including compound cathodes having a thin layer of metal such as Mg:Ag with an overlying transparent, electrically-conductive, sputter-deposited ITO layer. The part of cathode 160 that is in contact with the underlying organic layer, whether it is a single layer cathode 160, the thin metal layer 162 of a compound cathode, or some other part, is preferably made of a material having a work function lower than about 4 eV (a "low work function material"). Other cathode materials and structures may be used.

Blocking layers may be used to reduce the number of charge carriers (electrons or holes) and/or excitons that leave the emissive layer. An electron blocking layer 130 may be disposed between emissive layer 135 and the hole transport layer 125, to block electrons from leaving emissive layer 135 in the direction of hole transport layer 125. Similarly, a hole blocking layer 140 may be disposed between emissive layer 135 and electron transport layer 145, to block holes from leaving emissive layer 135 in the direction of electron transport layer 145. Blocking layers may also be used to block excitons from diffusing out of the emissive layer. The theory and use of blocking layers is described in more detail in U.S. Pat. No. 6,097,147 and United States Patent Application Publication No. 2003-02309890 to Forrest et al., which are incorporated by reference in their entireties.

As used herein, and as would be understood by one skilled in the art, the term "blocking layer" means that the layer provides a barrier that significantly inhibits transport of charge carriers and/or excitons through the device, without suggesting that the layer necessarily completely blocks the charge carriers and/or excitons. The presence of such a blocking layer in a device may result in substantially higher efficiencies as compared to a similar device lacking a blocking layer. Also, a blocking layer may be used to confine emission to a desired region of an OLED.

Generally, injection layers are comprised of a material that may improve the injection of charge carriers from one layer, such as an electrode or an organic layer, into an adjacent organic layer. Injection layers may also perform a charge transport function. In device 100, hole injection layer 120 may be any layer that improves the injection of holes from anode 115 into hole transport layer 125. CuPc is an example of a material that may be used as a hole injection layer from an ITO anode 115, and other anodes. In device 100, electron injection layer 150 may be any layer that improves the injection of electrons into electron transport layer 145. LiF/Al is an example of a material that may be used as an electron injection layer into an electron transport layer from an adjacent layer. Other materials or combinations of materials may be used for injection layers. Depending upon the configuration of a particular device, injection layers may be disposed at locations different than those shown in device 100. More examples of injection layers are provided in U.S. patent application Ser. No. 09/931,948 to Lu et al., which is incorporated by reference in its entirety. A hole injection layer may comprise a solution deposited material, such as a spin-coated polymer, e.g., PEDOT:PSS, or it may be a vapor deposited small molecule material, e.g., CuPc or MTDATA.

A hole injection layer (HIL) may planarize or wet the anode surface so as to provide efficient hole injection from the anode into the hole injecting material. A hole injection layer may also have a charge carrying component having HOMO (Highest Occupied Molecular Orbital) energy levels that favorably match up, as defined by their herein-described relative ionization potential (IP) energies, with the adjacent anode layer on one side of the HIL and the hole transporting layer on the opposite side of the HIL. The "charge carrying component" is the material responsible for the HOMO energy level that actually transports holes. This component may be the base material of the HIL, or it may be a dopant. Using a doped HIL allows the dopant to be selected for its electrical properties, and the host to be selected for morphological properties such as wetting, flexibility, toughness, etc. Preferred properties for the HIL material are such that holes can be efficiently injected from the anode into the HIL material. In particular, the charge carrying component of the HIL preferably has an IP not more than about 0.75 eV greater that the IP of the anode material. More preferably, the charge carrying component has an IP not more than about 0.5 eV greater than the anode material. Similar considerations apply to any layer into which holes are being injected. HIL materials are further distinguished from conventional hole transporting materials that are typically used in the hole transporting layer of an OLED in that such HIL materials may have a hole conductivity that is substantially less than the hole conductivity of conventional hole transporting materials. The thickness of the HIL of the present invention may be thick enough to help planarize or wet the surface of the anode layer. For example, an HIL thickness of as little as 10 nm may be acceptable for a very smooth anode surface. However, since anode surfaces tend to be very rough, a thickness for the HIL of up to 50 nm may be desired in some cases.

A protective layer may be used to protect underlying layers during subsequent fabrication processes. For example, the processes used to fabricate metal or metal oxide top electrodes may damage organic layers, and a protective layer may be used to reduce or eliminate such damage. In device 100, protective layer 155 may reduce damage to underlying organic layers during the fabrication of cathode 160. Preferably, a protective layer has a high carrier mobility for the type of carrier that it transports (electrons in device 100), such that it does not significantly increase the operating voltage of device 100. CuPc, BCP, and various metal phthalocyanines are examples of materials that may be used in protective layers. Other materials or combinations of materials may be used. The thickness of protective layer 155 is preferably thick enough that there is little or no damage to underlying layers due to fabrication processes that occur after organic protective layer 160 is deposited, yet not so thick as to significantly increase the operating voltage of device 100. Protective layer 155 may be doped to increase its conductivity. For example, a CuPc or BCP protective layer 160 may be doped with Li. A more detailed description of protective layers may be found in U.S. patent application Ser. No. 09/931,948 to Lu et al., which is incorporated by reference in its entirety.

Figure 2:
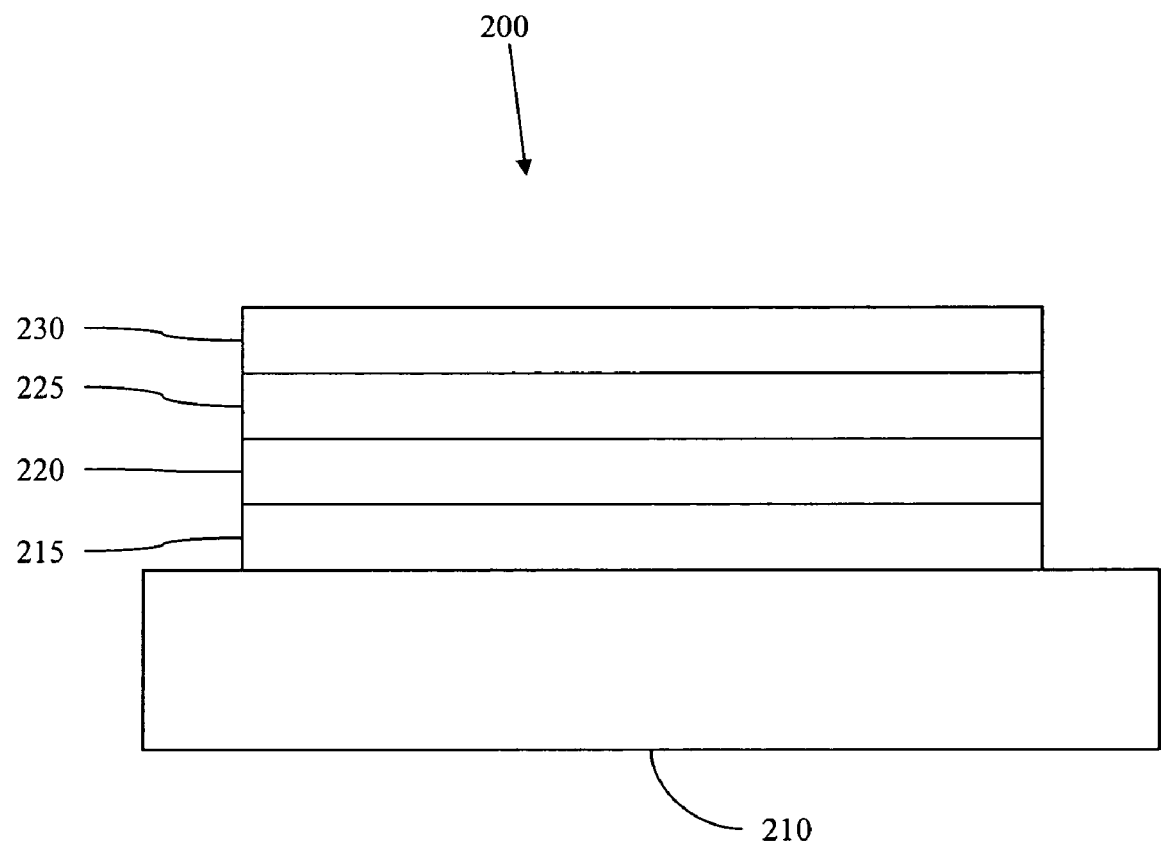
FIG. 2 shows an inverted organic light emitting device that does not have a separate electron transport layer.
Figure 3:
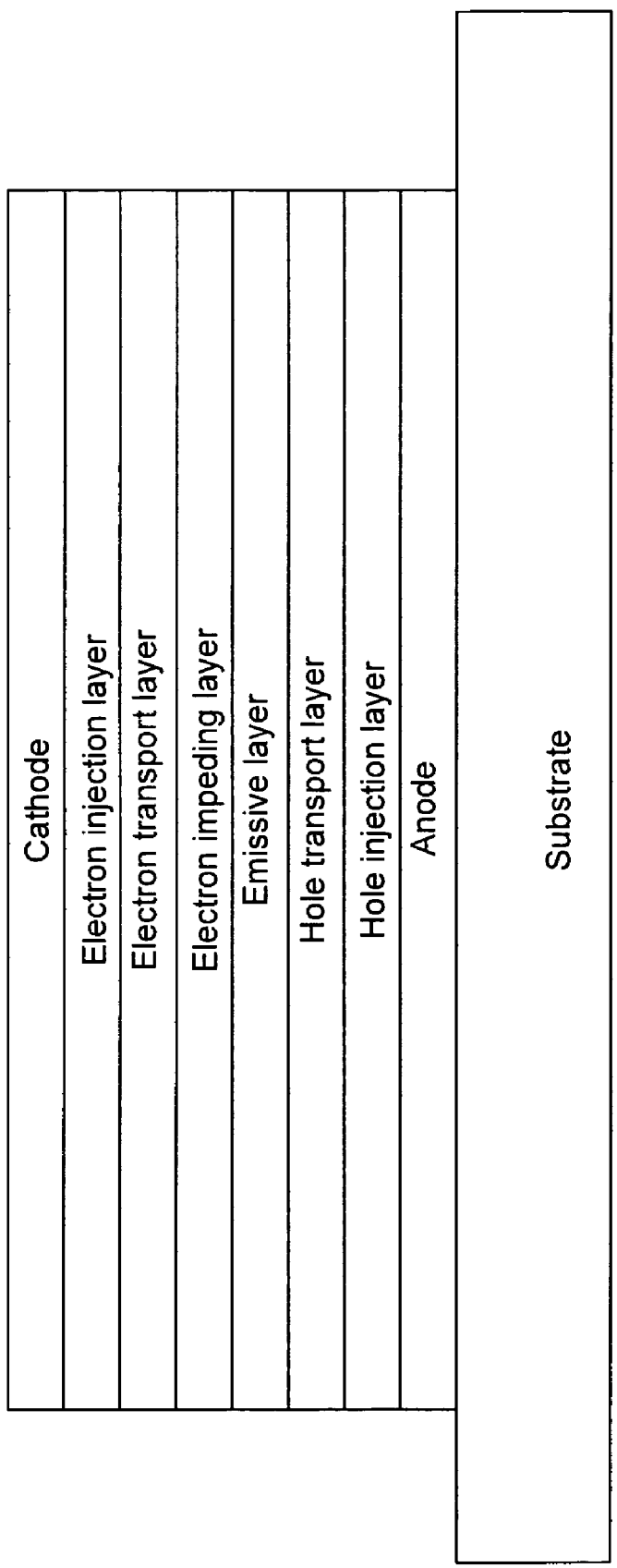
FIG. 3 shows an organic light emitting device including an electron impeding layer.

FIG. 2 shows an inverted OLED 200. The device includes a substrate 210, an cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190, Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve out-coupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. patent application Ser. No. 10/233,470, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJP. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

The molecules disclosed herein may be substituted in a number of different ways without departing from the scope of the invention. For example, substituents may be added to a compound having three bidentate ligands, such that after the substituents are added, one or more of the bidentate ligands are linked together to form, for example, a tetradentate or hexadentate ligand. Other such linkages may be formed. It is believed that this type of linking may increase stability relative to a similar compound without linking, due to what is generally understood in the art as a "chelating effect."

Devices fabricated in accordance with embodiments of the invention may be incorporated into a wide variety of consumer products, including flat panel displays, computer monitors, televisions, billboards, lights for interior or exterior illumination and/or signaling, heads up displays, fully transparent displays, flexible displays, laser printers, telephones, cell phones, personal digital assistants (PDAs), laptop computers, digital cameras, camcorders, viewfinders, micro-displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.).

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

In one embodiment, the present invention provides a device that addresses issues that arise when an OLED has an electron majority emissive layer. An electron majority emissive layer occurs when electrons migrate faster toward the anode side of the emissive layer than holes migrate toward the cathode side of the emissive layer. One type of electron majority emissive layer that is of particular concern is a hole trap, which occurs in some blue phosphorescent devices. A hole trap in the emissive layer can be achieved when the HOMO of the emissive layer host is at least about 0.5 eV lower, preferably about 0.5 eV to about 0.8 eV lower, than the HOMO of the emissive dopant. When holes enter such an emissive layer, the holes accumulate on dopant molecules near the hole transport layer/emissive layer interface. This, in turn, localizes recombination near the hole transport layer/ emissive layer interface where excitons may be quenched by the hole transport layer. Localization of recombination can be measured by techniques known in the art, such as by using a probe doped layer as described in U.S. patent application Ser. No. 11/110,776, which is incorporated herein by reference in its entirety. To avoid localization near the hole transport layer, it is desirable to shift the holes, and thus recombination, further into the emissive layer. Hole shifting can be accomplished by a variety of architectural features including, but not limited to, inserting an electron impeding layer, creating a LUMO barrier, using an electron transport layer that is actually a poor electron transporter, inserting a thick organic layer between the emissive layer and the cathode, selecting an emissive layer host material that is a poor electron transporter, selecting a dopant to alter electron mobility of the emissive or transport layers, or otherwise reducing the electron density of the emissive layer.

One way to lure the holes further into the emissive layer is to include a means for accumulating electrons between the emissive layer and the cathode. The accumulation of electrons redistributes the electric field across the emissive layer and forces recombination away from the hole transport layer/ emissive layer interface. The means for accumulating electrons can be, for example, an electron impeding layer.

Accordingly, in one embodiment, the present invention provides an OLED comprising an anode; a cathode; an organic emissive layer disposed between the anode and the cathode, the organic emissive layer comprising an emissive layer host and an emissive dopant, wherein the HOMO of the emissive layer host is at least about 0.5 eV lower, preferably about 0.5 eV to about 0.8 eV lower, than the HOMO of the emissive dopant; and a means for accumulating electrons between the cathode and the emissive layer. Preferably, the electrons are accumulated at the interface between the first and second organic layer.

In a preferred embodiment, the present invention provides an organic light emitting device, comprising: an anode; a hole transport layer; an organic emissive layer comprising an emissive layer host and an emissive dopant; an electron impeding layer; an electron transport layer; and a cathode disposed, in that order, over a substrate.

An electron impeding layer (IMP) is defined as a layer within the device, between the emissive layer and the cathode, that slows the transport of electrons to the emissive layer (EML), that has a current that is comprised of a majority of electrons, and that has a negligible hole current. Above a critical thickness (~50 Å) of the IMP, electron current is reduced, and hole-electron recombination can occur in the ETL. If the ETL is emissive, this recombination leads to undesired emission from the ETL. Hole blocking layers (HBLs) can be differentiated from IMPs because thicker HBLs generally do not restrict electron flow to the extent that recombination occurs in the ETL. The contrast between the emission spectra obtained by increasing the thickness of an electron impeding layer versus increasing the thickness of a hole blocking layer is demonstrated by FIGS. 12 and 13. See Example 2.

IMP layers generally have relative electron conductivities less than typical hole blocking layers (HBLs), e.g., $BAlq_2$, HPT, or BAlq. Preferably, the IMP layer has a relative electron conductivity that is not more than 0.001 of the electron mobility of Bphen, preferably not more than 0.0005 of the electron mobility of Bphen, and more preferably not more than 0.0001 of the electron mobility of Bphen. Suitable materials for the IMP include hole transporting materials and ambipolar materials. Materials can be characterized as hole transporting or ambipolar by fabricating a test OLED with the material in question sandwiched by an emissive HTL on its anode side and by an emissive ETL on its cathode side. Under applied voltage, such a device that contains a hole transporting material will have an EL spectrum dominated by the characteristic ETL EL. Under applied voltage, such a device that contains an ambipolar material will have an EL spectrum that contains substantial emission from both the HTL and ETL layers. Suitable test devices for characterizing a material as hole transporting or ambipolar could be fabricated, for example, as follows:

CuPc(100 Å)/NPD(300 Å)/material-in-question (300 Å)/$BAlq_2$(400 Å)/LiF(10 Å)/Al (1000 Å)

or CuPc(100 Å)/NPD(300 Å)/material-in-question (300 Å)/$Alq_3$(400 Å)/LiF (10 Å)/Al (1000 Å).

Suitable materials for the electron impeding layer include mCBP, which can be used in combination with many emissive layer materials, such as an emissive layer host that is mCP or mCBP and an emissive dopant that is one of compounds 1-5. See Table 1 and FIG. 4. This application is related to U.S. Provisional Application No. 60/678,170, filed on May 6, 2005, U.S. Provisional Application No. 60/701,929, filed on Jul. 25, 2005, U.S. Provisional Application entitled "IMPROVED STABILITY OLED MATERIALS AND DEVICES," which was filed on Sep. 20, 2005 and U.S. Utility Application entitled "IMPROVED STABILITY OLED MATERIALS AND DEVICES," being filed on Oct. 4, 2005. The contents of these applications is herein incorporated by reference in their entirety. In some preferred devices, the dopant compounds described in these related applications may be used as dopant in a device having an impeding layer.

Since the measurement of absolute electron conductivity or mobility tends to vary between laboratories and other experimental conditions, it is generally more reliable to compare the electron mobility of two materials measured in the same experimental setup, i.e., a new material may be tested against a common reference material such as Bphen whose mobility values have been published. The relative measurements can be carried out according to methods reported in the literature, such as: Yasuda, T. et al., *Jpn. J. Appl. Phys.*, Vol 41(9):5626-5629 (2002), Kulkarni, A. et al., *Chem. Mater.*, 16:4556-4573 (2004), Naka, S., *Applied Physics Letters*, 76(2):197-199 (2000), and Strohriegl, P., et al., *Adv. Mater.*, 14(20):1439-1452 (2002). The charge carrier mobility of a material may be estimated by application of a suitable experimental technique, such as time-of-flight (TOF), space charge limited current (SCLC) measurement, or field-effect (FE) methods, according to standard techniques.

One of skill in the art would recognize other combinations of materials that would achieve the electron conductivity contrast and thus be useful for the present invention. As demonstrated by the exemplary combinations, the electron impeding layer can be the same material as the emissive layer host.

To sum, an electron impeding layer is a layer between the emissive layer and the cathode that exhibits one or more of the following properties:

a) When used in an OLED in combination with a potentially emissive electron transporting layer such as $Alq_3$, emission is produced in the electron transporting layer when sufficiently high voltages are provided for much thicker IMP layers. The electron transporting layer may not be a material that typically emits when holes are forced into the electron transporting layer. Accordingly, in one embodiment, the device includes an organic layer consisting essentially of a material such that when said material is used in a similar device wherein the first organic layer is $Alq_3$, increasing the thickness of the second organic layer will cause emission from the first organic layer.

b) The electron impeding material can have a relative electron mobility and/or electron conductivity less than, or substantially less than, typical and specified hole blocking materials, such as Bphen, $BAlq_2$, HPT, or BAlq. Preferably, the IMP layer has a relative electron conductivity that is not more than 0.001 of the electron mobility of Bphen, preferably not more than 0.0005 of the electron mobility of Bphen, and more preferably not more than 0.0001 of the electron mobility of Bphen.

c) The electron impeding material can be a hole transporting material, i.e., a material having a hole mobility greater than its electron mobility. Thus, in one embodiment, the device includes an organic layer consisting essentially of a material having a hole mobility greater than its electron mobility, such as TCTA, Irppz, NPD, TPD, mCP, and derivatives thereof.

d) The electron impeding material can be an ambipolar material. Thus, in one embodiment, the device includes an organic layer consisting essentially of an ambipolar material, such as mCBP.

In a preferred embodiment, the emissive dopant has a HOMO that is about −5 eV or higher. In another preferred embodiment, the HOMO of the electron impeding layer material is at least about 0.5 lower than the HOMO of the emissive dopant. See FIG. 14. In yet another preferred embodiment, the band gap of the electron impeding layer material is larger than the band gap of the emissive dopant. FIGS. 15a and 15b depict an energy level diagram for a device having an exemplary electron impeding layer.

In a preferred embodiment, the electron impeding layer is a neat layer.

Preferably, the electron impeding layer has a thickness of about 20 Å to about 75 Å, preferably about 50 Å. If the electron impeding layer is too thin, the layer may not provide a continuous impediment to the electron flow. If the electron impeding layer is too thick, the extra thickness may provide too great an impediment to the electron flow and lead to exciton formation in the first organic layer.

In one embodiment, the present invention provides a device that emits blue light. In a preferred embodiment, the emissive dopant has a peak in the emission spectra that is less than about 500 nm, preferably less than 450 nm. The light emitted preferably has CIE coordinates of ($X \leq 0.2$, $Y \leq 0.3$). In a specific preferred embodiment, the emissive dopant is tris N-2,6 dimethylphenyl-2-phenylimidazole, referred to herein as compound 1.

In a preferred embodiment, the device exhibits increased efficiency relative to an otherwise equivalent device without the means for accumulating electrons, e.g., an otherwise equivalent device except that the electron impeding layer is replaced with an electron transport layer. A device of the present invention preferably has an unmodified external quantum efficiency is greater than about 5%. In preferred embodiments, the device exhibits increased efficiency, increased voltage, and a lifetime that is the same or better relative to an otherwise equivalent device without the means for accumulating electrons, e.g., without the electron impeding layer.

In another embodiment, the OLED comprises an anode; a cathode; an organic emissive layer disposed between the anode and the cathode, the organic emissive layer comprising an emissive layer host and an emissive dopant, wherein the HOMO of the emissive layer host is at least about 0.5 eV lower, preferably about 0.5 eV to about 0.8 eV lower, than the HOMO of the emissive dopant; a first organic layer disposed between the organic emissive layer and the cathode; a second organic layer disposed between, and in direct contact with, the organic emissive layer and the first organic layer; wherein the second organic layer consists essentially of a hole transporting material or an ambipolar material.

It is understood that the various embodiments described herein are by way of example only, and are not intended to limit the scope of the invention. For example, many of the materials and structures described herein may be substituted with other materials and structures without deviating from the spirit of the invention. It is understood that various theories as to why the invention works are not intended to be limiting. For example, theories relating to charge transfer are not intended to be limiting.

Material Definitions:

As used herein, abbreviations refer to materials as follows:

mCBP: 3,3'-N,N-dicarbazole-biphenyl

CBP: 4,4'-N,N-dicarbazole-biphenyl m-MTDATA 4,4',4"-tris(3-methylphenylphenlyamino)triphenylamine
Alq$_3$: 8-tris-hydroxyquinoline aluminum
Bphen: 4,7-diphenyl-1,10-phenanthroline
n-BPhen: n-doped BPhen (doped with lithium)
F$_4$-TCNQ: tetrafluoro-tetracyano-quinodimethane
p-MTDATA: p-doped m-MTDATA (doped with F$_4$-TCNQ)
Ir(ppy)$_3$: tris(2-phenylpyridine)-iridium
Ir(ppz)$_3$: tris(1-phenylpyrazoloto,N,C(2')iridium(III)
BCP: 2,9-dimethyl-4,7-diphenyl-1,10-phenanthroline
TAZ: 3-phenyl-4-(1'-naphthyl)-5-phenyl-1,2,4-triazole
CuPc: copper phthalocyanine.
ITO: indium tin oxide
NPD: N,N'-diphenyl-N—N'-di(1-naphthyl)-benzidine
TPD: N,N'-diphenyl-N—N'-di(3-toly)-benzidine
BAlq: aluminum(III)bis(2-methyl-8-hydroxyquinolinato)4-phenylphenolate
HPT: 2,3,6,7,10,11-hexaphenyltriphenylene
mCP: 1,3-N,N-dicarbazole-benzene
DCM: 4-(dicyanoethylene)-6-(4-dimethylaminostyryl-2-methyl)-4H-pyran
DMQA: N,N'-dimethylquinacridone
PEDOT:PSS: an aqueous dispersion of poly(3,4-ethylene-dioxythiophene) with polystyrenesulfonate (PSS)

EXPERIMENTAL

Specific representative embodiments of the invention will now be described, including how such embodiments may be made. It is understood that the specific methods, materials, conditions, process parameters, apparatus and the like do not necessarily limit the scope of the invention.

Figure 4:
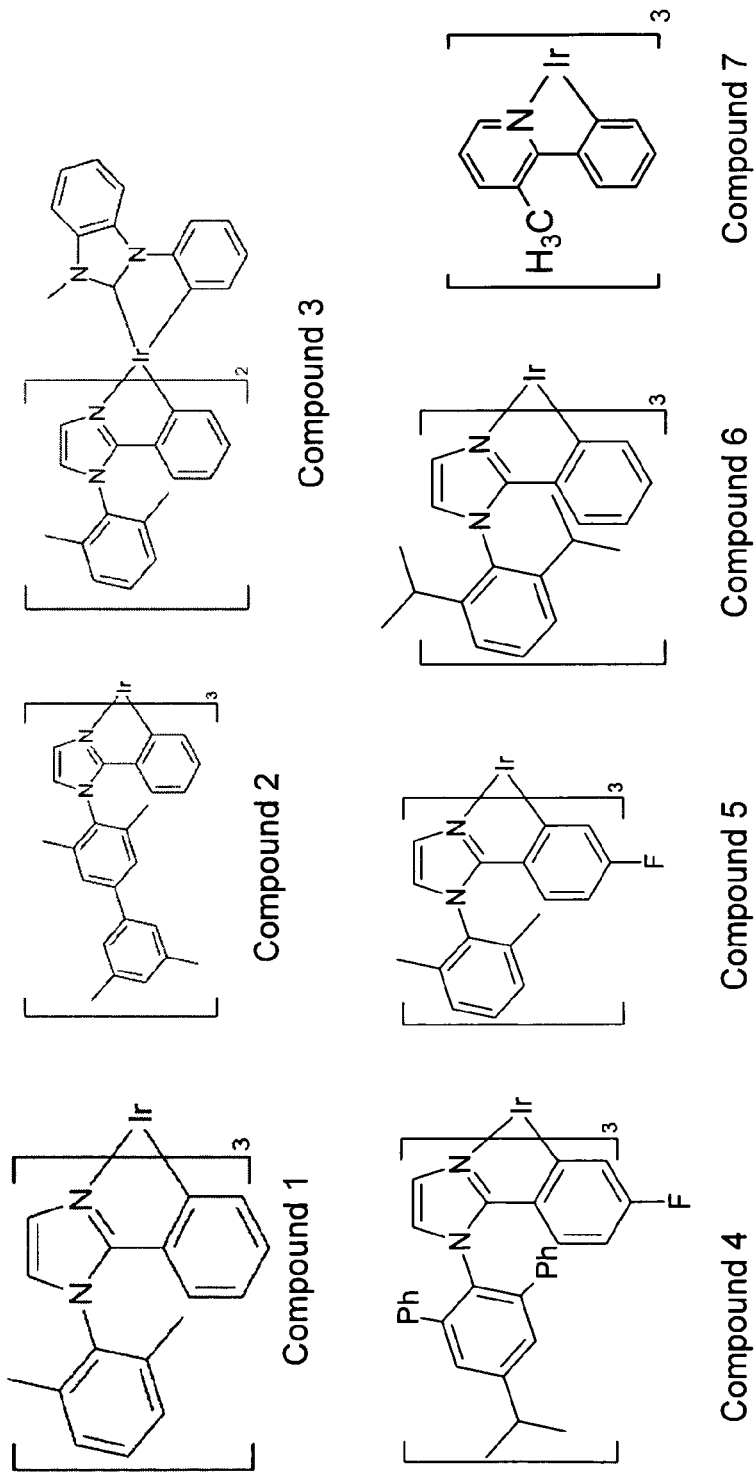
FIG. 4 shows the structures of compounds 1-5.

All devices are fabricated in high vacuum (<10$^{-7}$ Torr) by thermal evaporation. The anode electrode is about 800 Å of indium tin oxide (ITO). Organic layers were deposited at rates between 0.3 to 3.0 Å/s. The cathode consists of 10 Å of LiF, deposited at 0.1 Å/s, followed by 1,000 Å of Al, deposited at 2 Å/s. All devices are encapsulated with a glass lid sealed with an epoxy resin in a nitrogen glove box (<1 ppm of H$_2$O and O$_2$) immediately after fabrication, and a moisture getter was incorporated inside the package. The exemplary emissive dopants are shown in FIG. 4.

Example 1

Specific exemplary devices of the invention (numbered in bold) as well as comparative devices are listed in Table 1. It is understood that the specific methods, materials, conditions, process parameters, apparatus and the like do not necessarily limit the scope of the invention.

TABLE 1

Exemplary Devices and Comparative Devices

| Ex. | Structure (All thicknesses are in angstroms, and doping concentration are wt %.) |
|---|---|
| 1 | CuPc (100)/NPD (300)/mCBP:compound 1 (9%, 300)/mCP (50)/Balq (400)/LiF/Al |
| 2 | CuPc (100)/NPD (300)/mCBP:compound 1 (9%, 300)/Balq (400)/LiF/Al |
| 3 | CuPc (100)/NPD (300)/mCBP:compound 1 (18%, 300)/mCP (50)/Balq (400)/LiF/Al |
| 4 | CuPc (100)/NPD (300)/mCBP:compound 1 (18%, 300)/Balq (400)/LiF/Al |
| 5 | CuPc (100)/NPD (300)/mCBP:compound 1 (9%, 300)/mCBP (50)/Balq (400)/LiF/Al |
| 6 | CuPc (100)/NPD (300)/mCP:compound 1 (9%, 300)/mCP (50)/Balq (400)/LiF/Al |
| 7 | CuPc (100)/NPD (300)/mCP:compound 1 (9%, 300)/Balq (400)/LiF/Al |
| 8 | CuPc (100)/NPD (300)/mCP:compound 1 (9%, 300)/mCBP (50)/Balq (400)/LiF/Al |
| 9 | CuPc (100)/NPD (300)/mCBP:compound 2 (9%, 300)/mCP (50)/Balq (400)/LiF/Al |
| 10 | CuPc (100)/NPD (300)/mCBP:compound 2 (9%, 300)/Balq (400)/LiF/Al |
| 11 | CuPc (100)/NPD (300)/mCP:compound 3 (9%, 300)/mCP (50)/Balq (400)/LiF/Al |
| 12 | CuPc (100)/NPD (300)/mCP:compound 3 (9%, 300)/mCBP (50)/Balq (400)/LiF/Al |
| 13 | CuPc (100)/NPD (300)/mCP:compound 3 (9%, 300)/Balq (400)/LiF/Al |
| 14 | CuPc (100)/NPD (300)/mCBP:compound 4 (9%, 300)/mCBP (50)/Balq (400)/LiF/Al |
| 15 | CuPc (100)/NPD (300)/mCBP:compound 4 (9%, 300)/Balq (400)/LiF/Al |
| 16 | CuPc (100)/NPD (300)/mCBP:compound 4 (9%, 300)/mCP (50)/Balq (400)/LiF/Al |
| 17 | CuPc (100)/NPD (300)/mCP:compound 5 (9%, 300)/mCP (50)/Balq (100)/Alq (400)/LiF/Al |
| 18 | CuPc (100)/NPD (300)/mCP:compound 5 (9%, 300)/Balq (100)/Alq (400)/LiF/Al |

Figure 5:
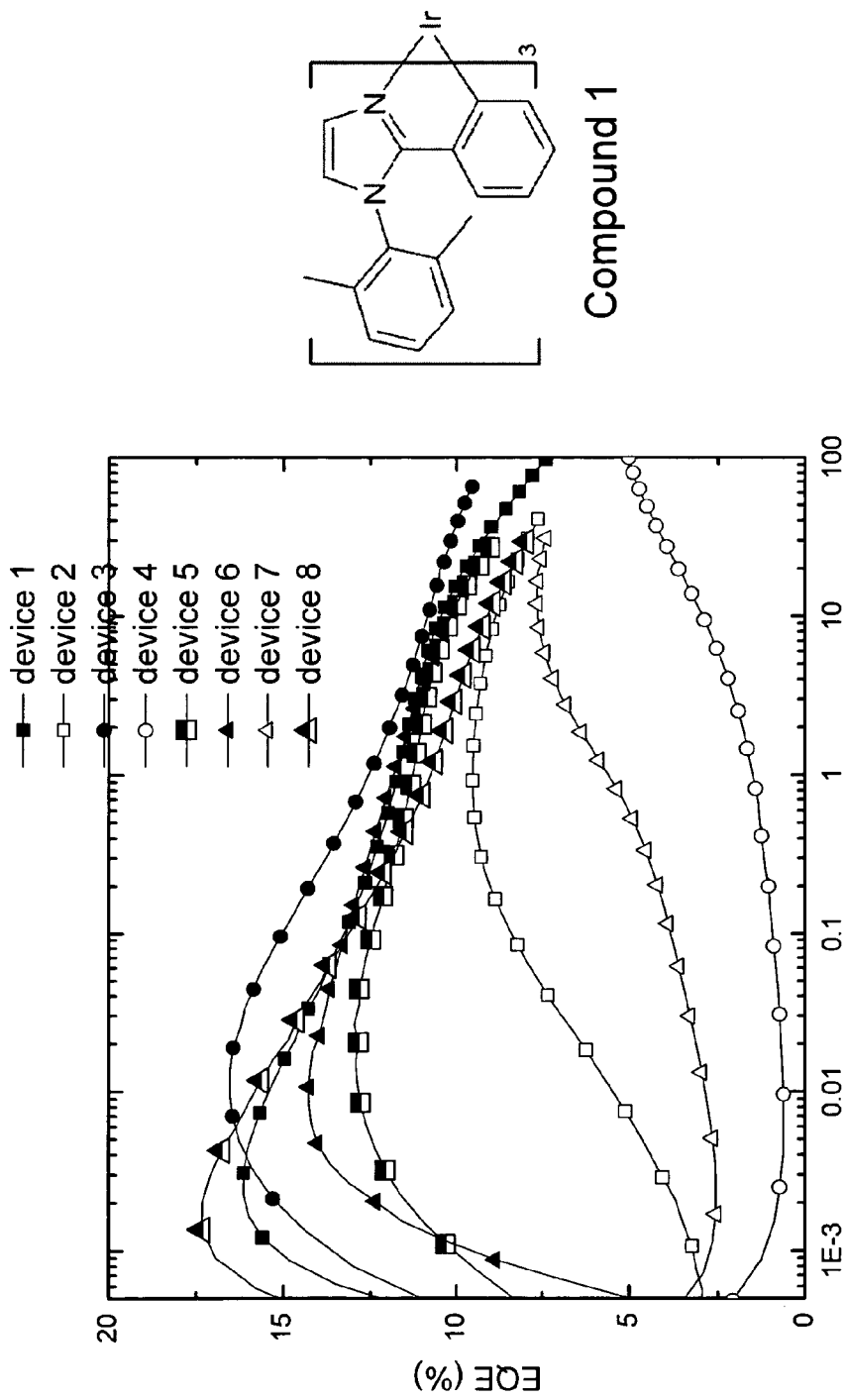
FIG. 5 shows the external quantum efficiency versus current density for compound 1 devices.
Figure 6:
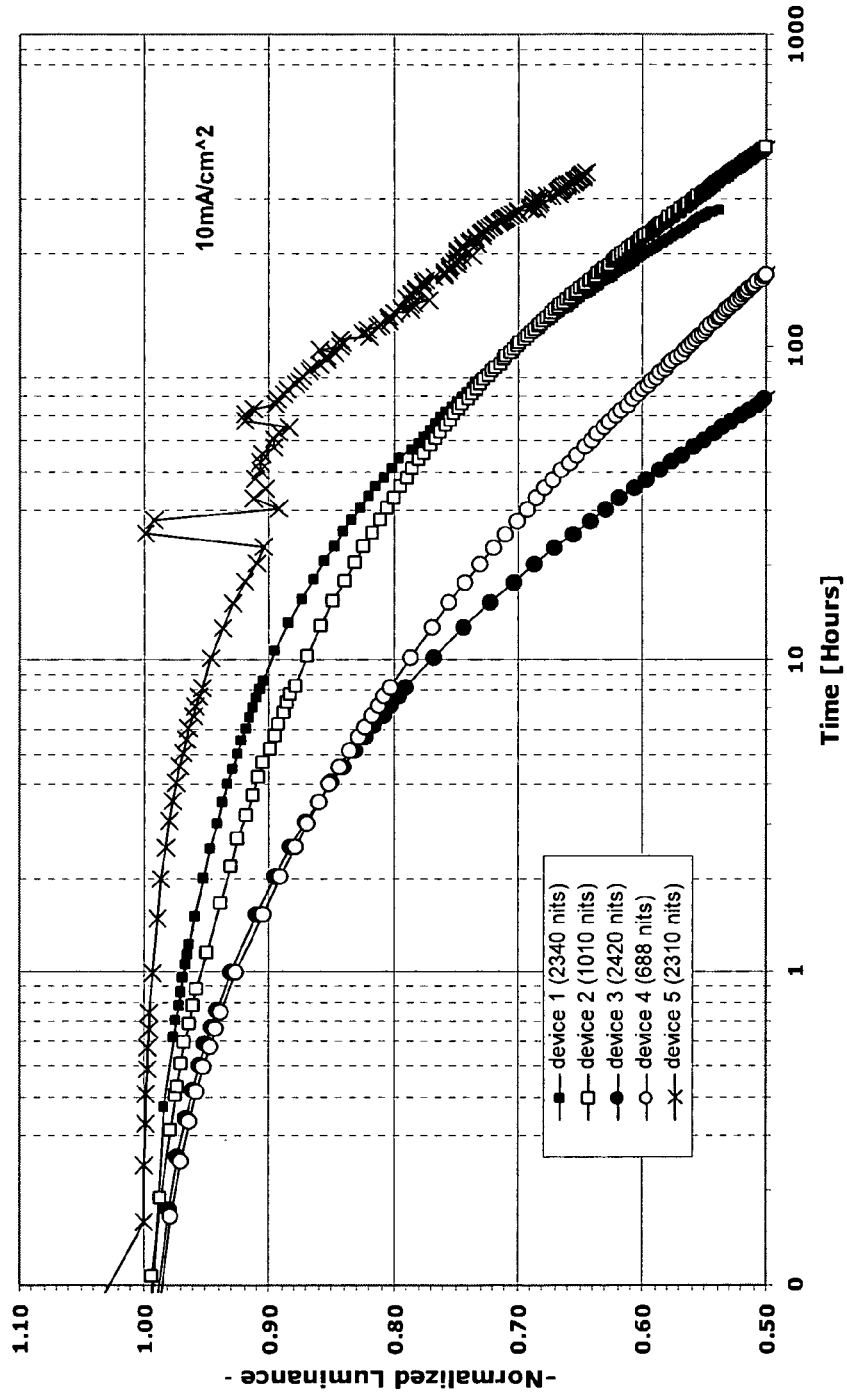
FIG. 6 shows the lifetime at room temperature with 10 $mA/cm^2$ for compound 1 devices.

FIG. 5 shows that among the devices utilizing dopant compound 1, the external quantum efficiency is higher for the exemplary devices including an electron impeding layer (devices 1, 3, 5, 6, and 8) relative to comparative devices without such a layer (devices 2, 4, and 7, shown by fully open symbols). FIG. 6 shows that exemplary devices 1, 3, and 5 have the same better lifetime relative to comparative devices 2 and 4.

Figure 7:
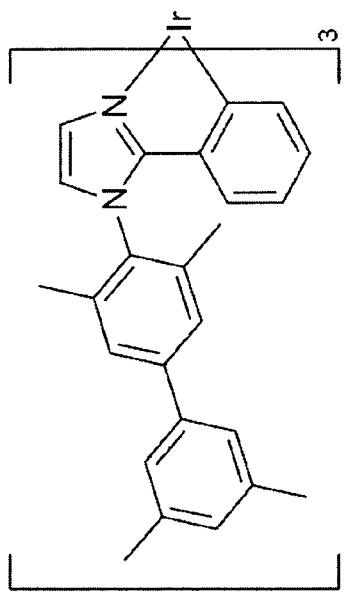
FIG. 7 shows the external quantum efficiency versus current density for compound 2 devices.
Figure 7:
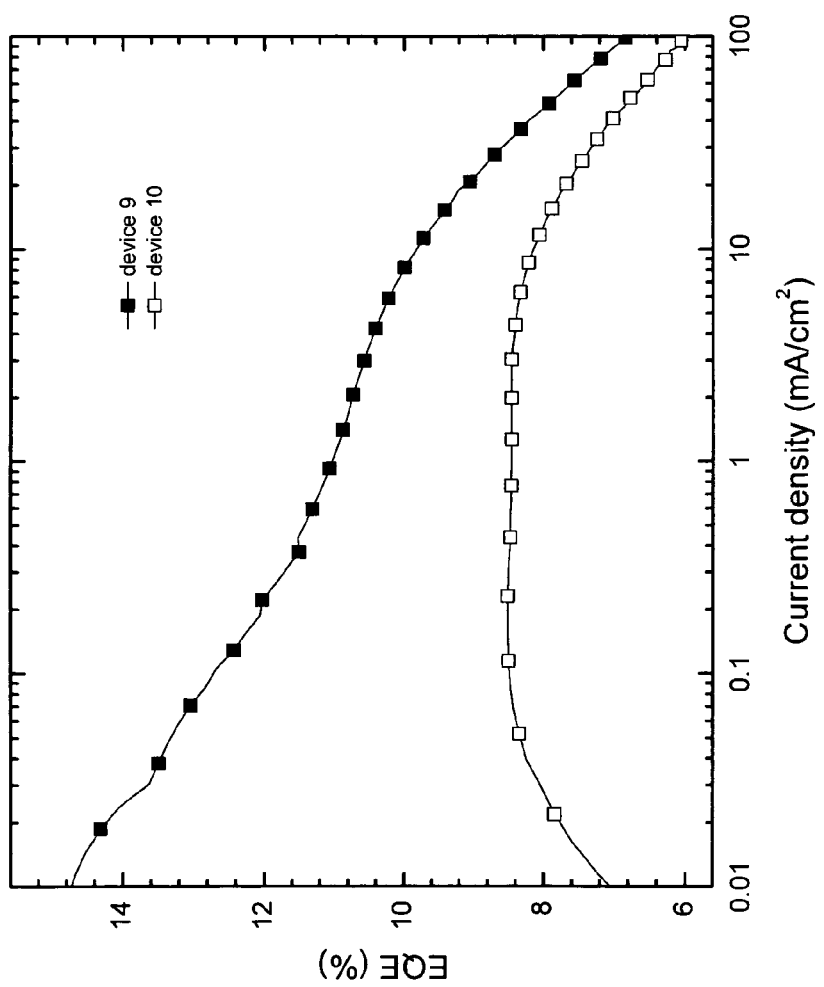

FIG. 7 shows that for the devices utilizing dopant compound 2, the external quantum efficiency is higher for the exemplary device 9 including an electron impeding layer relative to comparative device 10 without such a layer.

Figure 8:
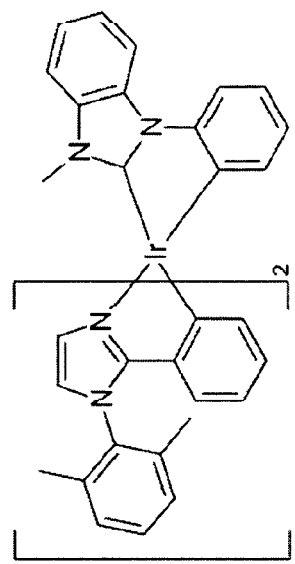
FIG. 8 shows the external quantum efficiency versus current density for compound 3 devices.
Figure 8:
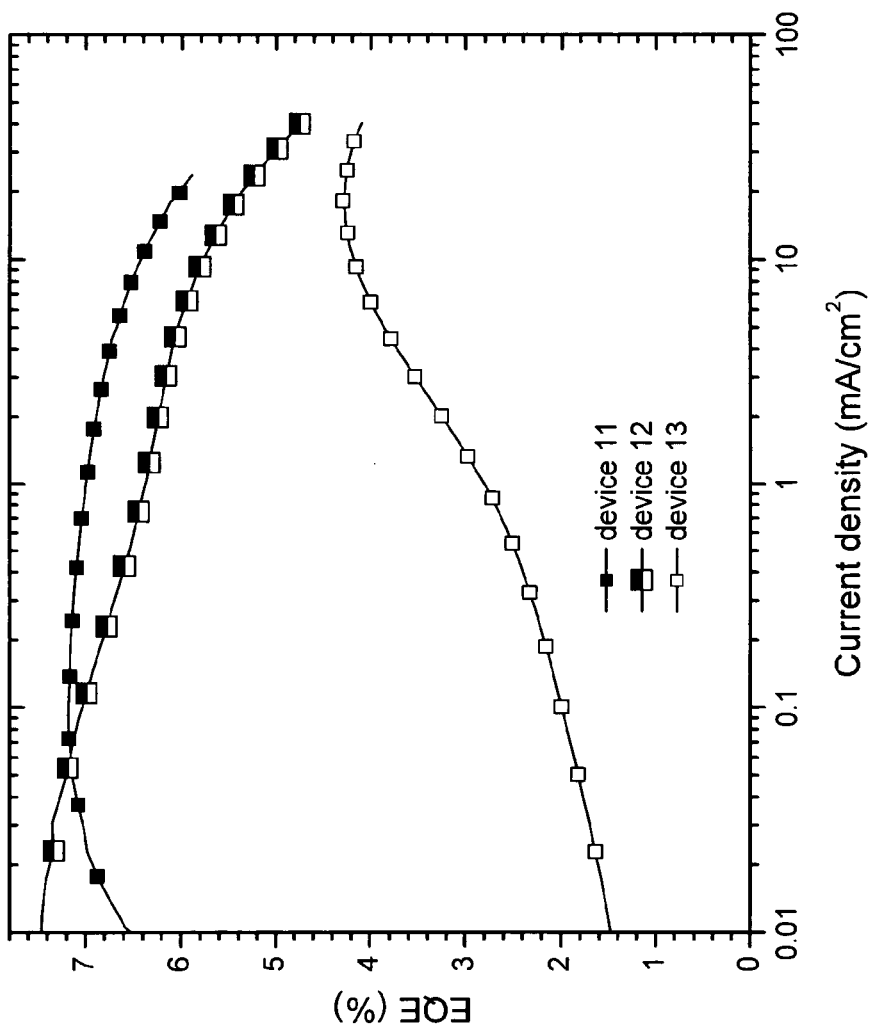

FIG. 8 shows that among the devices utilizing dopant compound 3, the external quantum efficiency is higher for the exemplary devices including an electron impeding layer (devices 11 and 12) relative to comparative device 13 without such a layer.

Figure 9:
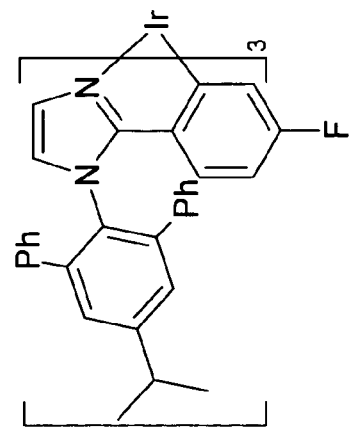
FIG. 9 shows the external quantum efficiency versus current density for compound 4 devices.
Figure 9:
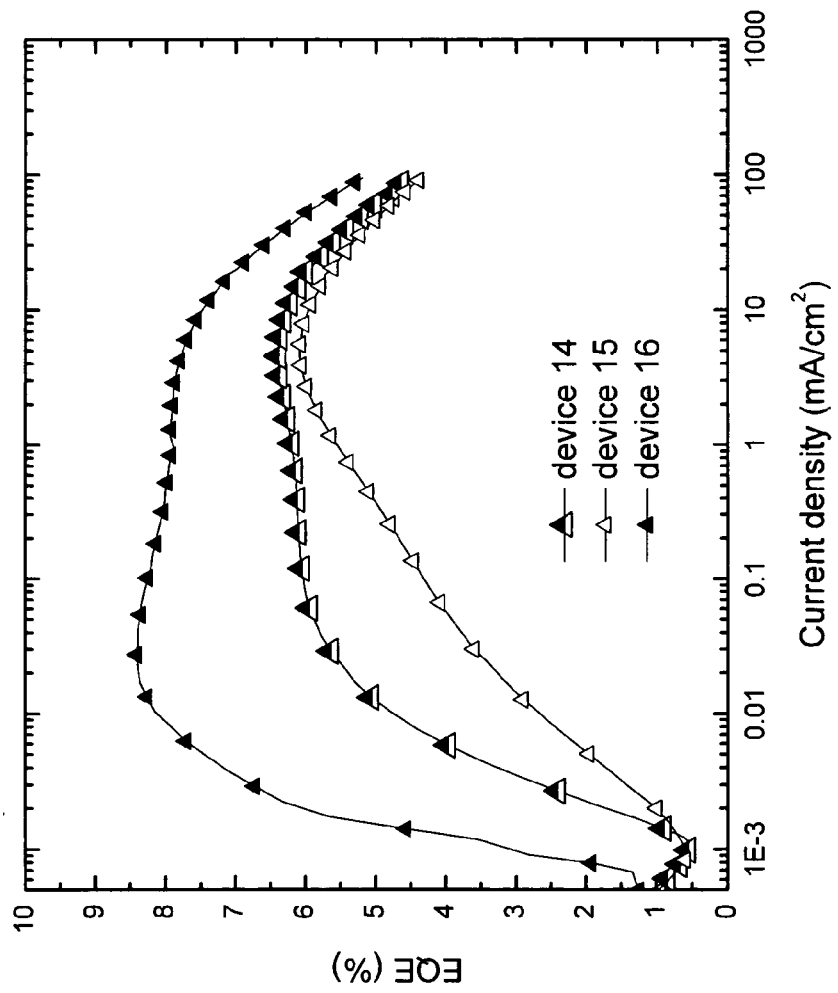
Figure 10:
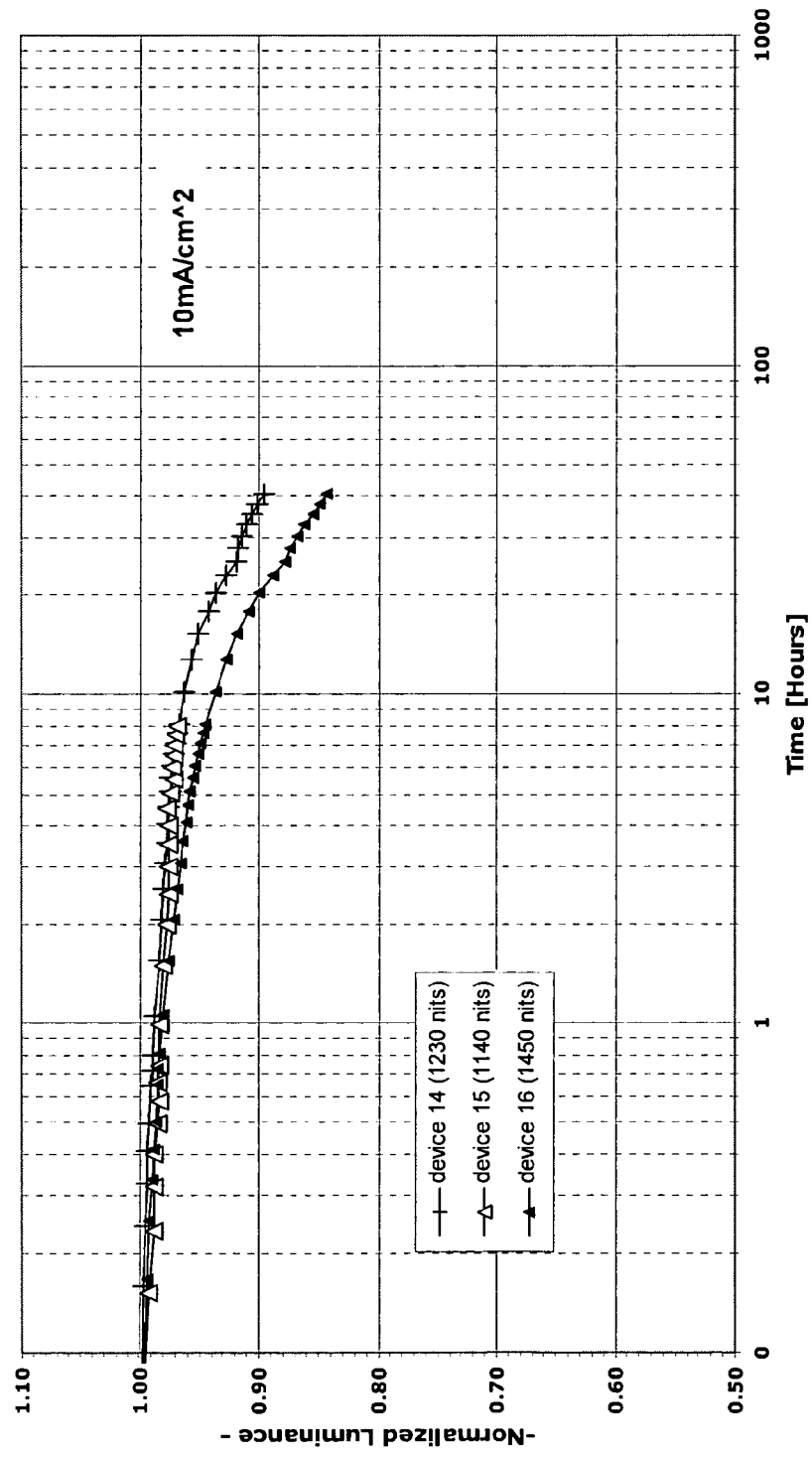
FIG. 10 shows the lifetime at room temperature with 10 $mA/cm^2$ for compound 4 devices.

FIG. 9 shows that among the devices utilizing dopant compound 4, the external quantum efficiency is higher for the exemplary devices including an electron impeding layer (devices 14 and 16) relative to comparative device 15 without such a layer. FIG. 10 shows that the exemplary devices have the same or better lifetime relative to the comparative device.

Figure 11:
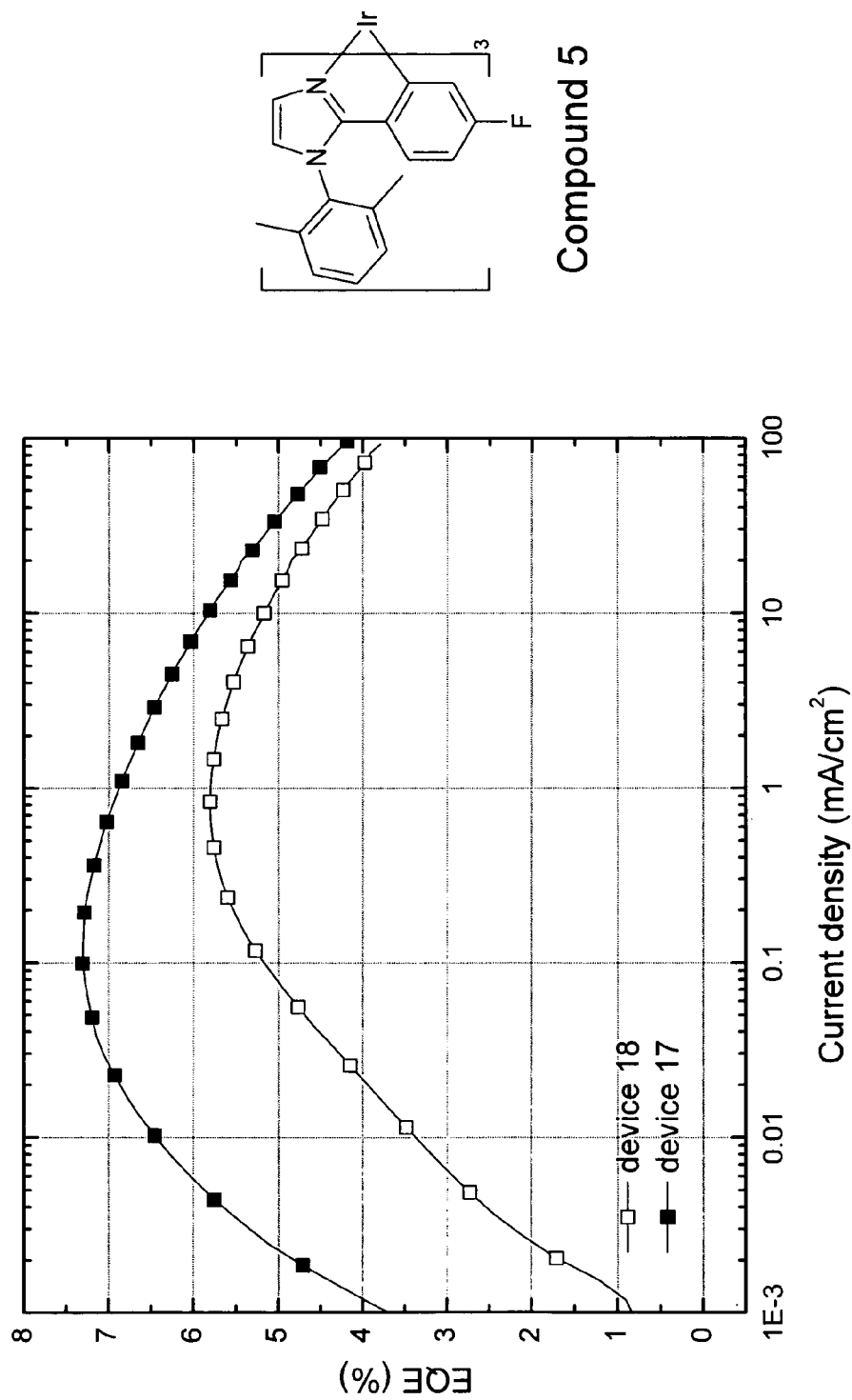
FIG. 11 shows the external quantum efficiency versus current density for compound 5 devices.

FIG. 11 shows that for the devices utilizing dopant compound 5, the external quantum efficiency is higher for the exemplary device 17 including an electron impeding layer relative to comparative device 18 without such a layer.

Example 2

Exemplary devices A-D include an electron impeding layer of variable thickness. Comparative devices E and F include a hole blocking layer of variable thickness.

TABLE 2

Exemplary Devices and Comparative Devices

| Ex. | Structure (All thicknesses are in angstroms, and doping concentration are wt %.) |
|---|---|
| A | CuPc (100)/NPD (300)/mCBP:compound 6 (9%, 300)/Alq$_3$ (400)/LiF/Al |
| B | CuPc (100)/NPD (300)/mCBP:compound 6 (9%, 300)/mCBP (20)/Alq$_3$ (400)/LiF/Al |
| C | CuPc (100)/NPD (300)/mCBP:compound 6 (9%, 300)/mCBP (50)/Alq$_3$ (400)/LiF/Al |
| D | CuPc (100)/NPD (300)/mCBP:compound 6 (9%, 300)/mCBP (100)/Alq$_3$ (400)/LiF/Al |
| E | Ir(ppy)$_3$ (100)/NPD (300)/CBP:compound7 (8%, 300)/HPT (50)/Alq$_3$ (450)/LiF/Al |
| F | Ir(ppy)$_3$ (100)/NPD (300)/CBP:compound7 (8%, 300)/HPT (150)/Alq$_3$ (350)/LiF/Al |

Figure 12:
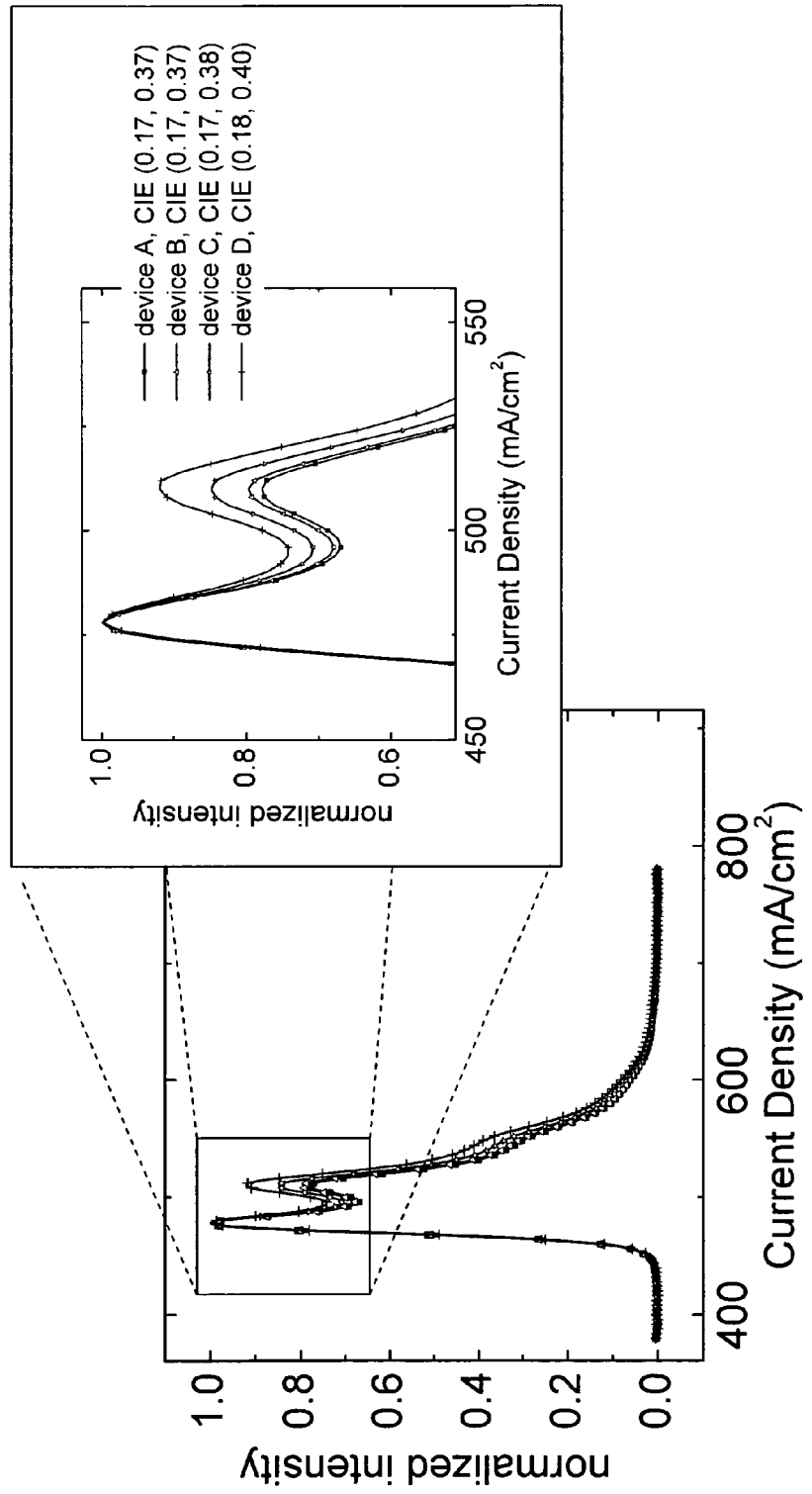
FIG. 12 shows the emission of devices as the thickness of an electron impeding layers is increased.

FIG. 12 shows that as the thickness of the electron impeding layer increases, the amount of emission in the electron transport layer increases.

Figure 13:
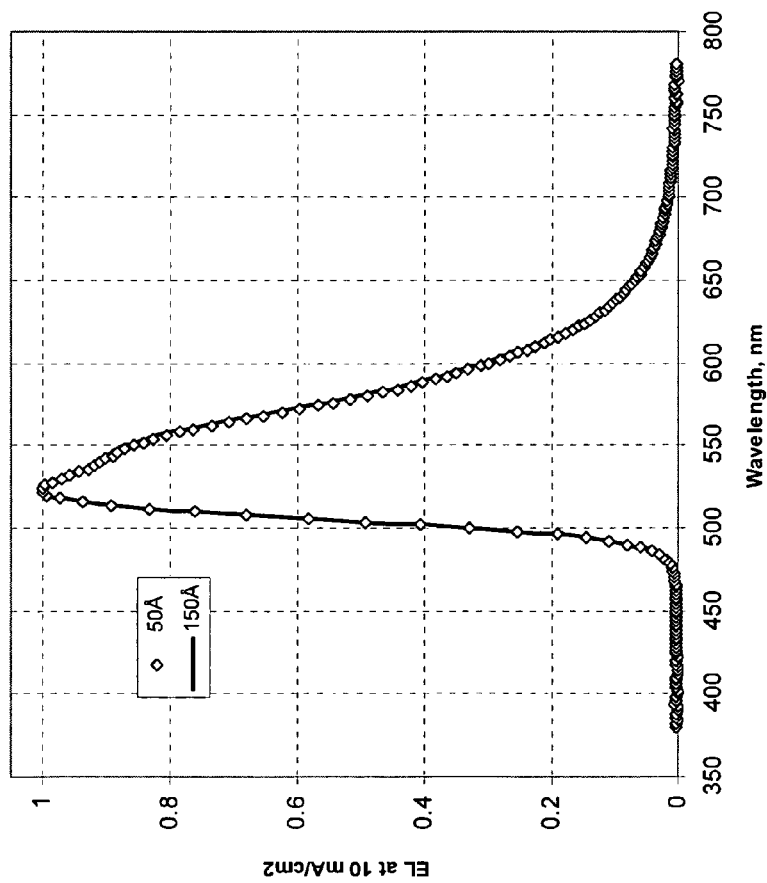
FIG. 13 shows the emission of devices as the thickness of a hole blocking layer is increased.

FIG. 13 shows that as the thickness of the hole blocking layer increases, there is no shift in emission.

All of the above publications, patents and patent applications are herein incorporated by reference in their entirety to the same extent as if each individual publication, patent or patent application was specifically and individually indicated to be incorporated by reference in its entirety.

While the present invention is described with respect to particular examples and preferred embodiments, it is understood that the present invention is not limited to these examples and embodiments. The present invention as claimed therefore includes variations from the particular examples and preferred embodiments described herein, as will be apparent to one of skill in the art.

What is claimed is:

1. An organic light emitting device, comprising:
   a) an anode;
   b) a hole transport layer;
   c) an organic emissive layer comprising an emissive layer host and an emissive dopant, wherein the HOMO of the emissive layer host is at least about 0.5 eV lower than the HOMO of the emissive dopant;
   d) an electron impeding layer, wherein the electron impeding layer has a thickness of about 20 Å to about 75 Å;
   e) an electron transport layer; and
   f) a cathode
   disposed, in that order, over a substrate;
   wherein: (i) the electron impeding layer consists essentially of the same material as the emissive layer host, or (ii) the organic emissive layer emits light with CIE coordinates of (X≦0.2, Y≦0.3), or (iii) the emissive dopant is selected from the group consisting of compounds 1-5.

2. An organic light emitting device, comprising:
   a) an anode;
   b) a hole transport layer;
   c) an organic emissive layer comprising an emissive layer host and an emissive dopant;
   d) an electron impeding layer consisting essentially of an ambipolar material, wherein the electron impeding layer has a thickness of about 20 Å to about 75 Å;
   e) an electron transport layer; and
   f) a cathode;
   disposed, in that order, over a substrate.

3. The device of claim 1, wherein the emissive dopant has a HOMO that is about −5 eV or higher.

4. The device of claim 3 or 2, wherein the emissive dopant is selected from the group consisting of compounds 1-5.

5. The device of claim 4, wherein the emissive dopant is compound 1.

6. The device of claim 1 or 2, wherein the electron impeding layer consists essentially of a material having a hole mobility greater than its electron mobility.

7. The device of claim 6, wherein the electron impeding layer consists essentially of a material selected from the group consisting of TCTA, Irppz, NPD, TPD, mCP, and derivatives thereof.

8. The device of claim 1, wherein the electron impeding layer consists essentially of an ambipolar material.

9. The device of claim 8 or 2, wherein the ambipolar material is mCBP.

10. The device of claim 1 or 2, wherein the electron impeding layer consists essentially of the same material as the emissive layer host.

11. The device of claim 1 or 2, wherein the electron impeding layer is a neat layer.

12. The device of claim 1, wherein the electron impeding layer has a thickness of about 50 Å.

13. The device of claim 1 or 2, wherein the HOMO of the electron impeding layer material is at least about 0.5 eV lower than the HOMO of the emissive dopant.

14. The device of claim 1 or 2, wherein the band gap of the electron impeding layer material is larger than the band gap of the emissive dopant.

15. The device of claim 1 or 2, wherein the emissive dopant has a peak in the emission spectra that is less than about 500 nm.

16. The device of claim 1 or 2, wherein the organic emissive layer emits light with CIE coordinates of (X≦0.2, Y≦0.3).

17. The device of claim 1 or 2, wherein the device is used in an active-matrix organic light emitting device display.

18. The device of claim 1 or 2, wherein the device exhibits increased efficiency relative to an otherwise equivalent device wherein the electron impeding layer is replaced with an electron transport layer.

19. The device of claim 18, wherein the device exhibits increased efficiency, increased voltage, and a lifetime that is the same or better relative to an otherwise equivalent device wherein the electron impeding layer is replaced with an electron transport layer.

20. The device of claim 1 or 2, wherein the unmodified external quantum efficiency is greater than about 5%.

21. The device of claim 1 or 2, wherein the HOMO of the emissive layer host is about 0.5 eV to about 0.8 eV lower than the HOMO of the emissive dopant.

22. The device of claim 8 or 2, wherein the organic emissive layer comprises an ambipolar material, wherein the ambipolar material in the organic emissive layer is the same or different from the ambipolar material in the electron impeding layer.

23. The device of claim 1 or 2, wherein the electron impeding layer has a relative electron mobility not more than 0.001 of the electron mobility of 4,7-diphenyl-1,10-phenanthroline (Bphen).

24. The device of claim 23, wherein the electron impeding layer has a relative electron mobility not more than 0.0005 of the electron mobility of Bphen.

25. The device of claim 24, wherein the electron impeding layer has a relative electron mobility not more than 0.0001 of the electron mobility of Bphen.

* * * * *